(12) United States Patent
Ben Hassen et al.

(10) Patent No.: US 10,488,454 B2
(45) Date of Patent: Nov. 26, 2019

(54) METHOD FOR GENERATING A MULTI-CARRIER REFLECTOMETRY SIGNAL FOR IMPLEMENTATION IN A DISTRIBUTED SYSTEM

(71) Applicant: COMMISSARIAT A L'ENERGIE ATOMIQUE ET AUX ENERGIES ALTERNATIVES, Paris (FR)

(72) Inventors: Wafa Ben Hassen, Paris (FR); Fabrice Auzanneau, Massy (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 371 days.

(21) Appl. No.: 15/032,555

(22) PCT Filed: Oct. 20, 2014

(86) PCT No.: PCT/EP2014/072394
§ 371 (c)(1),
(2) Date: Apr. 27, 2016

(87) PCT Pub. No.: WO2015/062885
PCT Pub. Date: May 7, 2015

(65) Prior Publication Data
US 2016/0266194 A1  Sep. 15, 2016

(30) Foreign Application Priority Data
Oct. 31, 2013  (FR) .................................... 13 60657

(51) Int. Cl.
*G01R 31/11* (2006.01)
*G01R 31/02* (2006.01)
*G01R 31/08* (2006.01)

(52) U.S. Cl.
CPC ............ *G01R 31/11* (2013.01); *G01R 31/086* (2013.01)

(58) Field of Classification Search
CPC ...... G01R 31/11; G01R 31/021; G01R 31/08; G01R 31/086
See application file for complete search history.

(56) References Cited

U.S. PATENT DOCUMENTS

| 5,483,169 A | * | 1/1996 | Despain | ................. | G01R 27/04 |
| | | | | | 324/533 |
| 7,221,169 B2 | * | 5/2007 | Jean | ...................... | G01N 22/00 |
| | | | | | 324/639 |

(Continued)

OTHER PUBLICATIONS

W. Ben Hassen et al., "Diagnosis Sensor Fusion for Wire Fault Location in CAN Bus Systems," 2013 IEEE Sensors, Nov. 3, 2013, pp. 1-4, XP032532504.

(Continued)

*Primary Examiner* — Neel D Shah
(74) *Attorney, Agent, or Firm* — Baker & Hostetler LLP (57) ABSTRACT

A method for generating a reflectometry signal for the diagnosis of defects impacting a transmission line or a network of transmission lines, the method executed by a diagnosis device belonging to a distributed system comprising a plurality of diagnosis devices connected to the line or network of lines, the method comprises the following steps: Generating an electrical signal comprising a plurality of frequency carriers regularly dispersed within a frequency band subdivided into sub-carriers so that each device of the distributed system uses different sub-carriers from the other devices of the system; injecting the electrical signal into the line or network of lines.

20 Claims, 6 Drawing Sheets

(56) References Cited

U.S. PATENT DOCUMENTS

| | | | | |
|---|---|---|---|---|
| 7,532,011 | B2* | 5/2009 | Shi | G01R 31/11 324/533 |
| 8,582,443 | B1* | 11/2013 | Sun | H04L 43/16 370/242 |
| 2006/0097730 | A1* | 5/2006 | Park | G01R 31/088 324/534 |
| 2011/0043244 | A1* | 2/2011 | Hall | G01R 31/11 324/764.01 |
| 2011/0227582 | A1* | 9/2011 | Ahamed | G01R 31/11 324/533 |
| 2012/0146666 | A1* | 6/2012 | Bottman | G01R 31/11 324/627 |
| 2013/0200904 | A1* | 8/2013 | Millet | G01R 31/11 324/533 |
| 2014/0316726 | A1* | 10/2014 | Franchet | G01R 31/11 702/59 |
| 2015/0222511 | A1* | 8/2015 | Fertner | H04B 3/493 370/252 |
| 2016/0139194 | A1* | 5/2016 | Cohen | G01R 31/11 324/533 |

OTHER PUBLICATIONS

P. Smith et al., "Analysis of Spread Spectrum Time Domain Reflectometry for Wire Fault Location," IEEE Sensors Journal, vol. 5, No. 6, pp. 1469-1478, Dec. 2005.

C. Lo et al., "Noise Domain Reflectometry for Locating Wiring Faults," IEEE Transactions on Electromagnetic Compatibility, vol. 47, No. 1, pp. 97-104, Feb. 2005.

S. Naik et al., "Multicarrier Reflectometry," IEEE Sensors Journal, vol. 6, No. 3, pp. 812-818, Jun. 2006.

A. Lelong et al., "On Line Wire Diagnosis using Multicarrier Time Domain Reflectometry for Fault Location," IEEE Sensors Conference, pp. 751-754, Oct. 2009.

N. Ravot et al,. "Distributed Reflectometry-based Diagnosis for Complex Wired Networks," EMC: Safety, Reliability and Security of Communication and Transportation System, EMC Workshop, Paris, Jun. 2007.

A. Lelong et al., "Distributed Reflectometry Method for Wire Fault Location Using Selective Average," IEEE Sensors Journal, vol. 10, No. 2, pp. 300-310, Feb. 2010.

W. Ben Hassen et al., "OMTDR using BER estimation for ambiguities cancellation in ramified networks diagnosis," 2013 IEEE 8th International Conference on Intelligent Sensors, Sensor Networks and Information Processing, Apr. 2013, pp. 414-419.

W. Ben Hassen et al., "On-Line Diagnosis using Orthogonal Multi-Tone Time Domain Reflectometry in a Lossy Cable," 2013 10th International Multi-Conference on Systems, Signals & Devices (SSD), Mar. 18-21, 2013, pp. 1-6.

Anonymous, "Window function—Wikipedia, the free encyclopedia," Oct. 19, 2013, XP055129219, retrieved Jul. 16, 2014 <http://en.wikipedia.org/w/index.php?title=Window_function&oldid=577892584>.

* cited by examiner

METHOD FOR GENERATING A MULTI-CARRIER REFLECTOMETRY SIGNAL FOR IMPLEMENTATION IN A DISTRIBUTED SYSTEM

CROSS-REFERENCE TO RELATED APPLICATIONS

This application is a National Stage of International patent application PCT/EP2014/072394, filed on Oct. 20, 2014, which claims priority to foreign French patent application No. FR 1360657, filed on Oct. 31, 2013, the disclosures of which are incorporated by reference in their entirety.

FIELD OF THE INVENTION

The present invention relates to the field of on-line diagnosis of complex wired networks consisting of transmission lines or cables of diverse kinds, for example electrical, coaxial, bifilar cables, made of parallel lines, twisted pair stranded cable or the like.

BACKGROUND

The invention lies within the field of reflectometry which consists, on the basis of the injection of one or more test signals into the cable or cable network to be tested, in measuring the reflected signal in the form of a reflectogram and in deducing therefrom an item of information on the discontinuities of impedances which are characteristic of electrical defects. In this manner it is possible to diagnose a complex wired network by detecting and locating possible defects.

The invention pertains in particular to a method for generating a multi-carrier reflectometry signal for implementation in a distributed-reflectometry system suitable for wired networks composed of numerous branches.

The invention also pertains to a method for diagnosing electrical defects on the basis of the injection of a multi-carrier reflectometry signal as well as a reflectometry device and a distributed system comprising a plurality of such devices.

The principle of reflectometry consists in injecting a signal onto a network of cables and then in measuring the echoes returned subsequent to the abrupt variation of the characteristic impedance of one or more transmission lines joined by connectors thus forming junctions. The characteristics of these echoes, such as the delay with respect to the test signal and the amplitude, make it possible to obtain information on the position and the type of the electrical defects present in this network.

In the case of on-line diagnosis, the test signal is dispatched over the network when the system to be diagnosed is in operation making it possible to experience the real conditions of the system and therefore to establish a more thorough diagnosis such as the characterization of intermittent or so-called transient defects. However, it is necessary to avoid any interference between the signals that are related to the operation of the target system and those injected by the reflectometry system. This is manifested by diverse constraints (varying from one application to another) as regards electromagnetic compatibility, mutual interference of the signals or robustness to noise.

This problem of interference is worse in the case of distributed diagnosis where several reflectometers perform a reflectometry measurement at several points of the target network simultaneously. The various signals which propagate in the network are liable to interfere mutually and thus to falsify the results of the diagnosis.

The field of reflectometry contains several methods which make it possible to respond, in certain cases of applications, to certain constraints of an on-line diagnosis. The following methods may be cited in particular.

SSTDR reflectometry ("Spread Spectrum Time Domain Reflectometry"), as described in the document referenced [1], is based on STDR reflectometry ("Sequence Time Domain Reflectometry"). It makes it possible to displace the spectrum of the signal emitted by way of the application of a modulation by a carrier frequency of the pseudo-random binary sequences of STDR reflectometry. However, the spectral occupancy is twice as large as with STDR reflectometry and the spectrum can just be shifted but not fully controlled.

NDR reflectometry ("Noise Domain Reflectometry"), as described in the document referenced [2], makes it possible to carry out reflectometry without emitting any signal. It is the signals already present on the line which are used. Although this method can be beneficial in certain cases, it exhibits major drawbacks: the signals present in the network of cables must have the appropriate properties, the processings are more complex and the test signals are not periodic, this having consequences on the complexity of the processing and on the quality of the measurement.

MCR reflectometry ("MultiCarrier Reflectometry"), as described in the document referenced [3], uses multi-carrier signals. Its benefit is the great flexibility with which the spectrum of the emitted signal can be modulated, thereby making it possible to accommodate constraints specific to on-line diagnosis. For example, if it is prohibited to emit on a frequency band situated in the middle of the spectrum of the test signal, it is entirely possible to cancel the energy of the signal on this band of frequencies. The proposed method remains, however, very limited since it allows only simple and uniform transmission lines to be diagnosed.

MCTDR reflectometry ("MultiCarrier Time Domain Reflectometry") is also known, as described in the document referenced [4].

These methods of the known art suffer from a lack of flexibility in ensuring good on-line diagnosis in the case of a network of complex topology with the presence of non-straightforward defects. Knowing that the spectral occupancy of the test signal is one of the major aspects in ensuring good on-line diagnosis on the network of cables, the spectrum of the signal must make it possible to limit the interference with the operation of the application without degrading the quality of the reflectogram obtained.

In the case of a complex wired network, the detection and the location of one or more straightforward or non-straightforward defect(s) turn out to be impossible with a single injection point. Distributed reflectometry seems to be a good solution for remedying this problem. Distributed reflectometry is intended to mean the injection of the test signal at several points of the network and the recovery of the reflected signal at one or more points according to the chosen diagnosis strategy.

The document referenced [5] describes a reflectometry method, which consists in using pseudo-random sequences of M sequence type (or "Maximum Length Sequence") as test signal and in minimizing the inter-correlation between the sequences generated by the various reflectometers. Thereafter, the post-processing (discrimination algorithm) consists in applying a suitable filtering as in the STDR method ("Sequence Time Domain Reflectometry"). The major drawbacks of this strategy are the following. On the one hand, it does not allow complete cancellation of the contribution of the other reflectometers. Residual noise remains. On the other hand, it requires the use of a signal of M sequence type (or LFSR, "Logical Feedback Shift Register" with maximum length). Indeed, in certain cases of application, test signals, such as multi-carrier signals, may be necessary on account of the constraints of the application concerned.

The document referenced [6] has proposed as recourse a method of selective averages which is totally independent of the test signal. The main idea is to insert weighting coefficients on emission of the signal and on reception when calculating the average. The choice of these coefficients is based on the Walsh-Hadamard sequences. This method makes it possible to obtain negligible levels of residual noise, but it turns out to be limited in the case of a complex network since the number of measurements increases in an exponential manner with the number of reflectometers in the network. In this case, the calculation of the selective averages demands a non-negligible calculation time in the case of several reflectometers, thus questioning the ability of the method to ensure real-time diagnosis, in particular as regards intermittent defects.

SUMMARY OF THE INVENTION

The invention proposes to alleviate the limitations of the known reflectometry methods through the use of a multi-carrier reflectometry signal based on OFDM (Orthogonal Frequency Division Multiplexing) technology used in the field of digital communications.

Document [7] describes the basic principle of so-called OMTDR reflectometry ("Orthogonal Multi-Tone Time Domain Reflectometry") which consists in using mutually orthogonal frequency carriers to avoid interference between reflectometers connected to one and the same wired network.

The invention proposes in particular a method for allocating the sub-carriers of an OMTDR reflectometry signal to the various devices of a distributed reflectometry system so as to limit the interference between signals and to ensure on-line diagnosis of constant quality whatever device is used in the system.

The subject of the invention is thus a method for generating a reflectometry signal for the diagnosis of defects impacting a transmission line or a network of transmission lines, said method being executed by a diagnosis device belonging to a distributed system comprising a plurality of diagnosis devices connected to said line or to said network of lines, said method comprising the following steps:

Generating an electrical signal comprising a plurality of frequency carriers dispersed at regular intervals over the whole of a frequency band subdivided into sub-carriers so that each device of said distributed system uses different sub-carriers from the other devices of said system, Injecting said electrical signal into said line or network of lines.

According to a particular aspect of the invention, the sub-carriers are mutually orthogonal.

According to a particular aspect of the invention, at least one sub-carrier is not used by any of said diagnosis devices of said distributed system.

According to a particular aspect of the invention, at least one sub-carrier is reserved for the communication between at least two diagnosis devices of said distributed system.

The subject of the invention is also a method for analyzing defects impacting a transmission line or a network of transmission lines, said method being executed by a diagnosis device belonging to a distributed system comprising a plurality of diagnosis devices connected to said line or to said network of lines, said method comprising the following steps:

Generating an electrical signal comprising a plurality of frequency carriers dispersed at regular intervals over the whole of a frequency band subdivided into sub-carriers so that each device of said distributed system uses different sub-carriers from the other devices of said system, Injecting said electrical signal into said line or network of lines, Analyzing the echo of said reflected electrical signal to deduce therefrom an item of information relating to the detection and/or the location of discontinuities of impedance characteristic of at least one defect.

According to a particular aspect of the method for analyzing defects according to the invention, the step of analyzing the echo of said reflected electrical signal comprises at least the following sub-steps:

The inter-correlation of the reflected signal with the injected signal to obtain a first reflectogram, The convolution of the first reflectogram with an apodization window to obtain a second reflectogram, The identification of amplitude spikes in said second reflectogram.

According to a particular aspect of the method for analyzing defects according to the invention, the apodization window is a Dolph-Chebyshev window.

The subject of the invention is also a device for generating a reflectometry signal for the diagnosis of defects impacting a transmission line or a network of transmission lines, said device comprising means suitable for implementing the method for generating a reflectometry signal according to the invention.

According to a variant embodiment, said device according to the invention comprises means suitable for implementing the method for analyzing defects according to the invention.

The subject of the invention is further a distributed system for the diagnosis of defects impacting a transmission line or a network of transmission lines, said system comprising a plurality of devices for analyzing defects according to the invention connected to said line or to said network of lines.

BRIEF DESCRIPTION OF THE DRAWINGS

Other characteristics and advantages of the present invention will be better apparent on reading the description which follows in relation to the appended drawings which represent.

DETAILED DESCRIPTION

Figure 1:
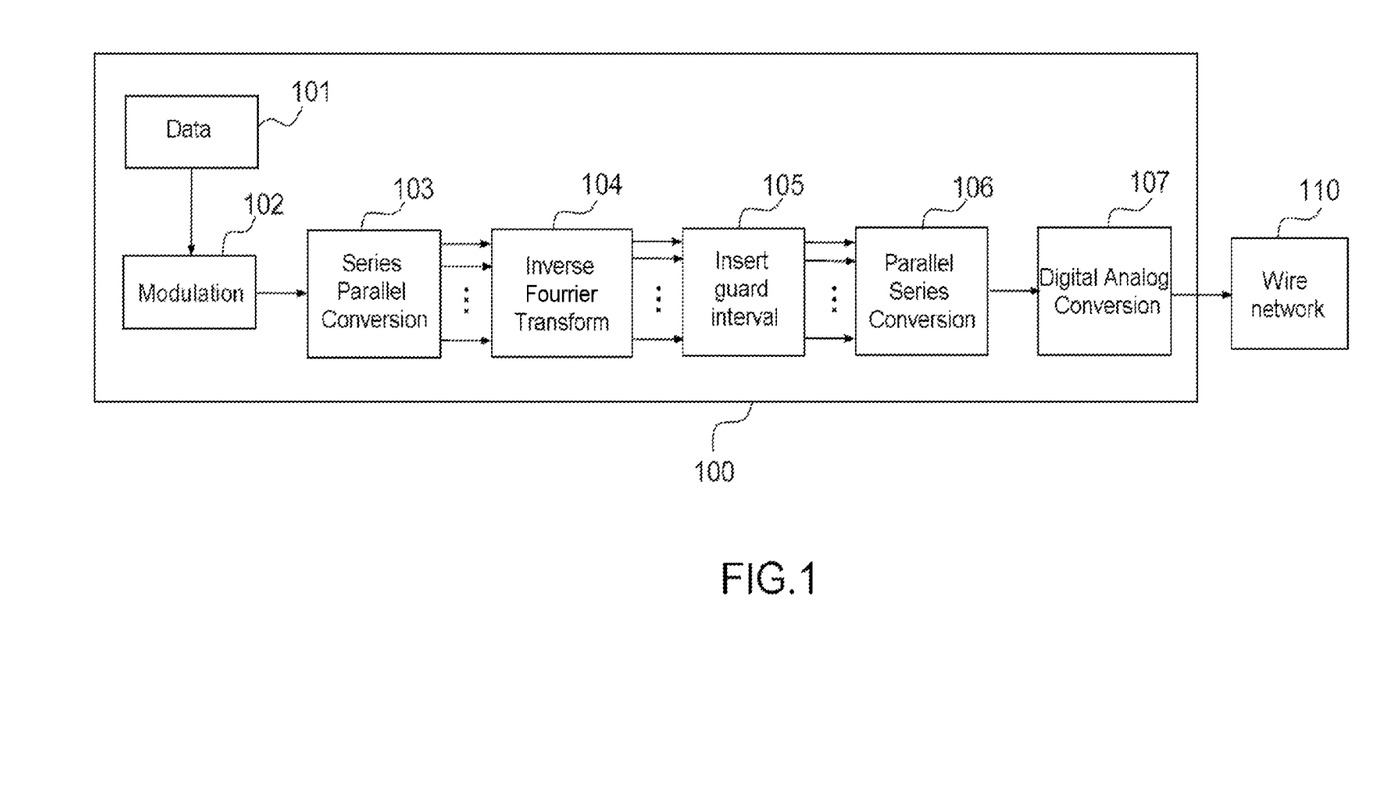
FIG. 1, a schematic of a device for generating an orthogonal multi-carrier reflectometry signal, FIG. 2, a diagram illustrating the frequency spectrum of a signal generated by a device according to FIG. 1, FIG. 3, a schematic of a device for analyzing an orthogonal multi-carrier reflectometry signal, FIGS. 4a and 4b, two diagrams illustrating the principle, according to the invention, of distributed allocation of the sub-carriers of an orthogonal multi-carrier reflectometry signal, FIG. 5, a schematic of a distributed reflectometry system for the diagnosis of electrical defects, FIGS. 6a, 6b, 6c, three reflectograms illustrating the contribution of the invention in relation to a standard method for allocating sub-carriers.

FIG. 1 represents, in a schematic, a device 100 for generating a reflectometry signal according to the invention.

It comprises in particular a module for generating digital data 101 which may be random or convey an information message. These data may be formatted in the form of frames comprising various fields. A frame can in particular contain a preamble which makes it possible to synchronize the signal, a frame start identifier, an identifier of the source device which has generated the signal, an identifier of a destination device for the signal within a distributed system comprising several devices. A frame can also contain a field making it possible to deduce the length of the data transmitted in a frame, a section containing the data themselves, a CRC cyclic redundancy check field making it possible to detect possible errors in the frame and a frame end identifier.

The module for generating digital data 101 can also generate a train of bits without a priori format or according to a format other than that described hereinabove.

The device 100 also comprises a modulator 102 which makes it possible to represent the binary train generated in the form of a set of modulated complex symbols. The modulation employed may be an M-state quadrature amplitude modulation, M being an integer greater than 2, a phase modulation or any other modulation.

The device 100 also comprises a series-parallel conversion module 103 which makes it possible to multiplex the modulated signal as a plurality of channels which are thereafter provided to a module for calculating the inverse Fourier transform 104 of the signal so as to perform a conversion in the frequency domain. Thus, it is possible to transmit a set of the complex symbols simultaneously on a plurality of frequencies.

A frequency sub-carrier of index n can be described by the following function $g_n(t)$: $g_n(t)=e^{j2\pi\Delta ft}$ for t belonging to the time interval $[0, T_s]$ and $g_n(t)=0$ outside of this interval.

To guarantee orthogonality between the sub-carriers, the frequency difference between two adjacent sub-carriers must be at least equal to $\Delta f=1/T_S$.

A module 105 for inserting a temporal guard interval of duration $T_G$ makes it possible to prevent the symbols from interfering mutually. Each symbol is thus preceded by a periodic extension of the signal itself. The total duration of the transmitted symbol is $T=T_S+T_G$.

The device 100 finally comprises a parallel-series conversion module 106 for demultiplexing the multi-carrier signal and then a digital-analog conversion module 107 so as to generate a multi-carrier reflectometry analog signal ready to be injected into a wired network 110.

Figure 2:
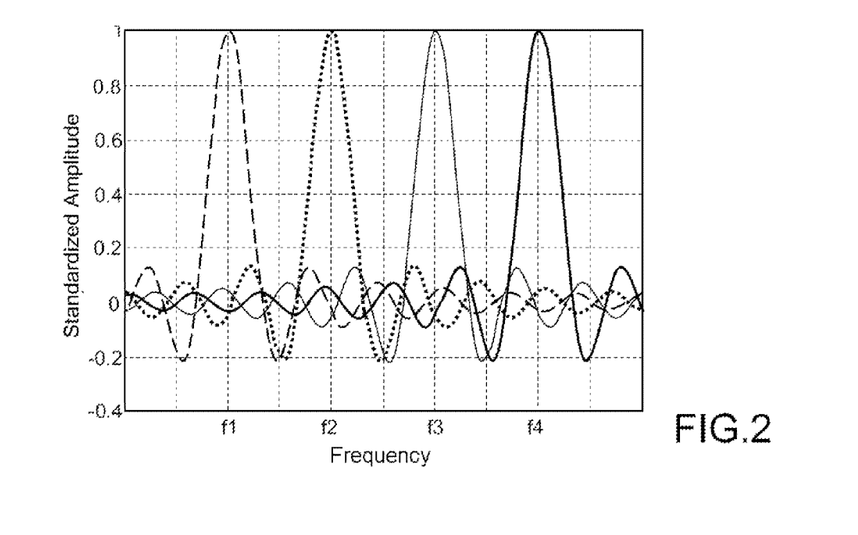

FIG. 2 represents, in a frequency diagram, the shape of the spectrum of the multi-carrier signal obtained subsequent to the steps described in FIG. 1 for a particular case where the number of sub-carriers is equal to 4.

Figure 3:
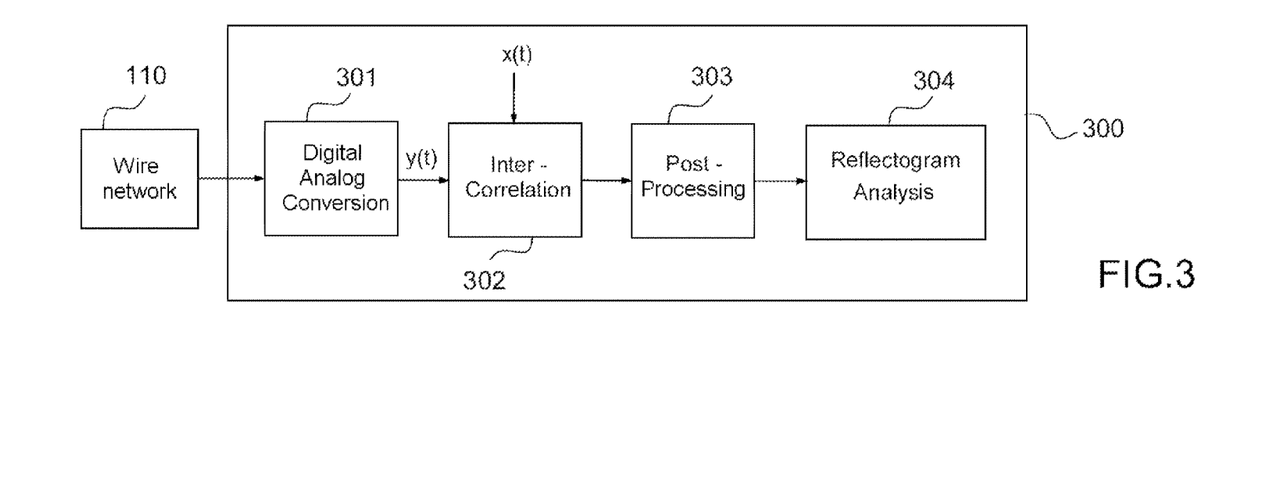

FIG. 3 represents, in a schematic, a device 300 for analyzing the reflectometry signal injected by a device 100 according to FIG. 1 into a wired network.

Such a device 300 measures the echoes of the multi-carrier reflectometry signal injected into the wired network 110. An analog-digital conversion module 301 makes it possible to digitize the measured signal y(t) which is thereafter provided to an intercorrelation module 302 which carries out the inter-correlation between the measured signal y(t) and the injected test signal x(t) so as to obtain a temporal reflectogram. The injected test signal x(t) can be obtained in various ways. Firstly, the device 100 for generating the reflectometry signal and the device 300 for analyzing the reflected signal can be implemented according to one and the same item of equipment, in which case the test signal x(t) is communicated directly to the intercorrelation module 302 in digital form. If the two devices 100,300 are distinct, a central entity (not represented) can provide the two devices with the necessary information so that they can generate the same test signal locally. Another solution, making it possible to avoid the use of an additional item of equipment, is to save in memory in each device 100,300 the set of test signals that it is envisaged to use. Each analysis device 300 can thereafter be programmed to associate with the measured signal the test signal to be used as a function of the identifier of the device 100 which generated and transmitted the reflectometry signal received.

A post-processing module 303 can be used to eliminate the sidelobes present around each spike of the reflectogram. This module can consist of the application of an apodization window, for example a Dolph-Chebyshev window. Stated otherwise, the reflectogram obtained after the inter-correlation step 302 is convolved with a time window obtained, for example with the aid of the following relation:

$$\omega(t) = TF^{-1}\left[\frac{\cos(N\cos^{-1}(\beta \cos(\frac{\pi t}{N})))}{\cos(N\cosh^{-1}(\beta))}\right]$$

$\beta$ is a ripple constant of the stopband and is defined by the relation $\beta=\cos h(\cos h^{-1}(10)/N)$ with N the number of samples used to produce the window $\omega$, cos h( ) designating the hyperbolic cosine function and cos $h^{-1}$( ) its inverse function.

The objective of the convolution of the reflectogram with an apodization window, for example a Dolph-Chebyshev window, is to reduce the sidelobes around the spikes of interest of the reflectogram, said sidelobes possibly coinciding with spikes resulting from non-straightforward defects.

Other equivalent windows are also conceivable.

Finally, an analysis module 304 makes it possible to identify the amplitude spikes in the reflectogram which are associated with impedance discontinuities present in the tested network of cables so as to detect the associated defects and/or to locate them.

Within the framework of a distributed-reflectometry system comprising a plurality of reflectometry devices connected to the network of cables to be tested and in which each connected device can generate a multi-carrier reflectometry signal such as described hereinabove in support of FIGS. 1 and 2, the problem arises of interference between the various reflectometry signals generated.

To solve this problem, the use of a signal comprising a plurality of mutually orthogonal carriers makes it possible, by allocating part of the available carriers to each device of the distributed system, to avoid the phenomena of collision between two reflectometry signals generated by two distinct devices and which would occupy identical frequency bands or which are partially superimposed.

To allocate the various frequency carriers available in the frequency band concerned to the various devices of the system, the immediate solution consists in dividing the frequency band into several adjacent sub-bands each allocated to a device.

Figure 4A:
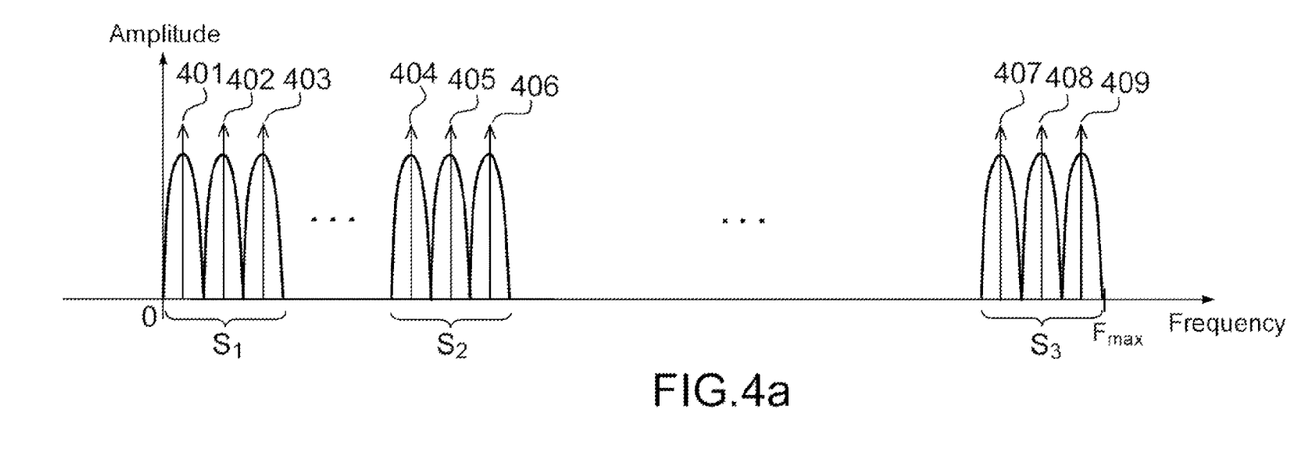

FIG. 4a represents on an amplitude-frequency diagram the spectrum of a multi-carrier signal whose sub-carriers are dispersed between three reflectometry devices S1, S2, S3 according to this first solution. By taking the sub-carriers in increasing order of the values of their central frequencies, a first group of adjacent sub-carriers 401,402,403 (3 sub-carriers in the example of FIG. 4a) are allocated to a first device S1. A second group of adjacent sub-carriers 404,405, 406 with central frequencies of greater values than those of the first group are allocated to a second device S2. Finally, a third group of adjacent sub-carriers 407,408,409 situated at the opposite end of the frequency band of the signal are allocated to a third device S3.

This solution of allocating sub-carriers in increasing order of the values of their central frequencies exhibits drawbacks. Indeed, in the scenario of FIG. 4a, the first device S1 uses sub-carriers situated substantially in the low frequencies, the second device S2 uses sub-carriers situated in the middle frequencies whereas the third device S3 uses sub-carriers situated in the high frequencies. This difference in use of the spectrum gives rise to a difference in perspective of the network seen by the various reflectometry devices S1,S2,S3. Indeed, the reflectograms ultimately obtained can differ when the signals used exhibit spectral occupancies that are very far apart in frequency. In particular, the use of sub-carriers that are far apart in frequency from the continuous component may engender artifacts in the measured reflectogram. Furthermore the attenuation of the signal during its propagation in the network of cables under test also depends on the frequency of the signal. Indeed, the attenuation is greater for the high frequencies than for the low frequencies. For all these reasons, the solution consisting in allocating the band of frequencies of the multi-carrier reflectometry signal to the various devices of a distributed system in increasing order of the frequencies is not an efficacious solution.

Figure 4B:
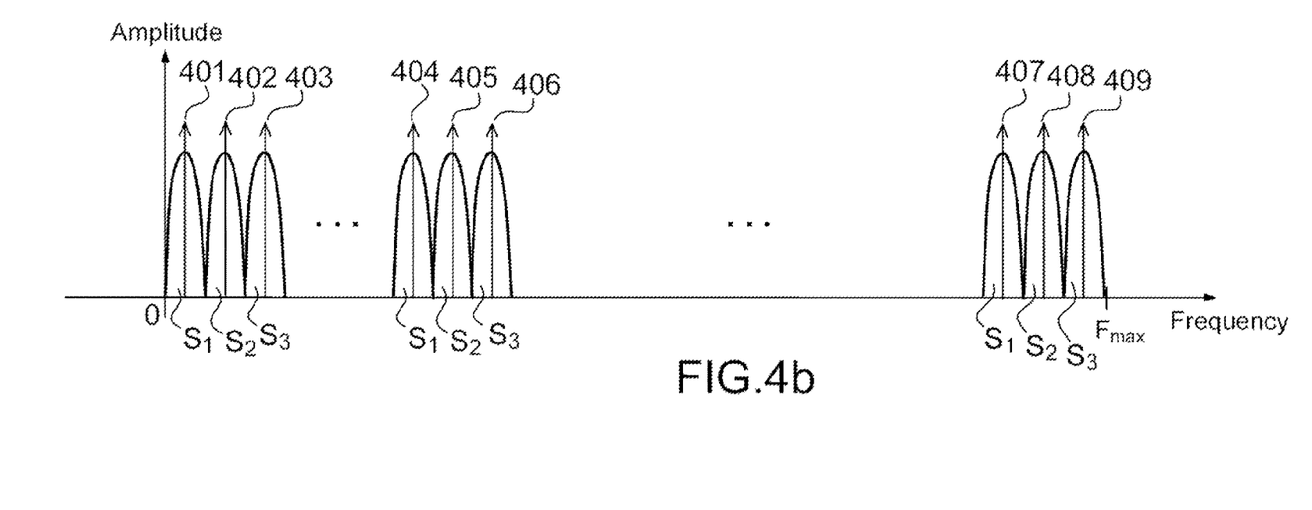

To solve the problems mentioned hereinabove, the invention proposes to allocate the sub-carriers of the test signal in a distributed manner such as represented in FIG. 4b.

The sub-carriers are allocated to the various devices in such a way that a device uses frequencies regularly dispersed in the band and that all the devices use test signals operating at close frequencies. Stated otherwise, the frequencies allocated to one device are dispersed at regular intervals within the whole of the frequency band so that each signal injected by each device exhibits the closest possible spectral profile while complying with the fact that each device uses different frequencies from the other devices of the same system.

In the example of FIG. 4b, the sub-carriers are alternately allocated to one of the three devices S1,S2,S3 so that the sub-carriers 401,404,407 are allocated to the first device S1, the sub-carriers 402,405,408 are allocated to the second device S2, the sub-carriers 403,406,409 are allocated to the third device S3.

Proceeding in this manner ensures that each reflectometry device S1,S2,S3 will generate a multi-carrier signal using frequencies that are regularly dispersed in the useful band. All the generated signals then exhibit a close spectral profile, thereby making it possible to avoid the difference in perspectives of the wired network and thereby ensuring that homogeneous reflectograms are obtained.

To generate a multi-carrier signal comprising non-adjacent sub-carriers, a solution consists in canceling the symbols corresponding to the sub-channels that one wishes to delete in the signal. Stated otherwise, at the output of the inverse Fourier transform module 104, the symbols of the outputs whose index corresponds to the number of the sub-carrier to be canceled in the useful band of the signal are canceled. This should be done before the allocation phase above described.

As indicated in the example of FIG. 4b, not all the sub-carriers of the useful band of the signal are necessarily allocated to a reflectometry device to generate a test signal with a view to the analysis of the electrical defects of the network. Certain sub-carriers may be reserved or prohibited since they correspond to spans of frequencies of signals useful to the operation of the network of cables that one wishes to test. So as not to disturb the operation of the network, no parasitic signal should be emitted in these prohibited spans. The orthogonality of the sub-carriers ensures that the useful signals of the network of cables are not actually disturbed by the injected reflectometry signals.

Other sub-carriers can be reserved for purposes other than the obtaining of a reflectogram and in particular can be allocated to the communication between two or more devices of the distributed system with the aim of exchanging information via the data possibly transported by the signal.

It should also be noted that the principle of distributed allocation described in FIG. 4b can be applied identically in respect of a multi-carrier signal whose sub-carriers are not mutually orthogonal. In such a case, use is made of carriers spaced sufficiently far apart as not to generate interference.

Figure 5:
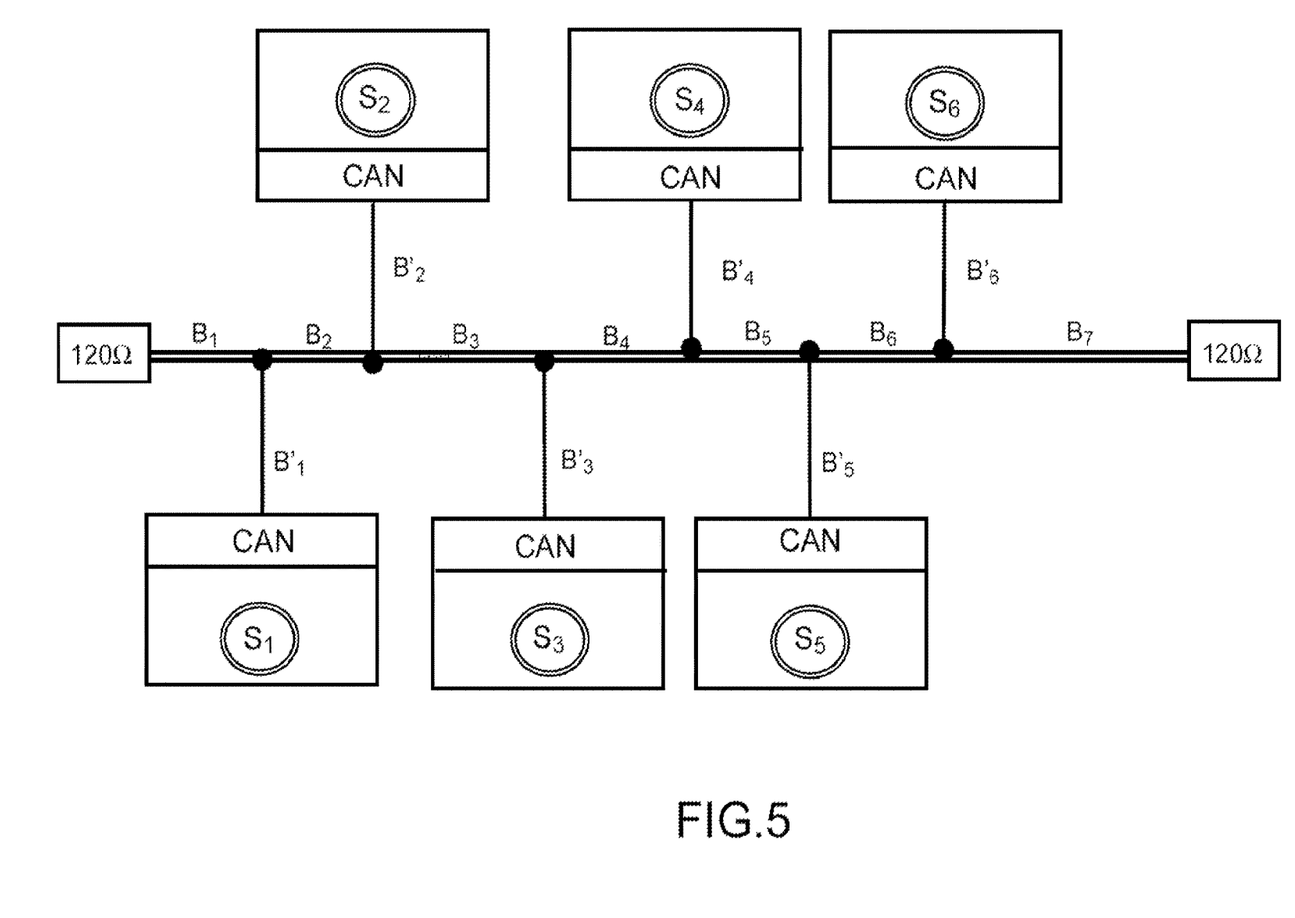

FIG. 5 shows diagrammatically an exemplary distributed reflectometry system according to the invention comprising six reflectometry devices S1,S2,S3,S4,S5,S6 connected to a network shown diagrammatically by a transmission line 500. Each device can generate and inject a multi-carrier reflectometry signal into the line 500. Each device can also measure an echo of the reflected signal to demodulate the data included in this signal and/or generate a reflectogram to analyze the amplitude spikes that it contains and deduce therefrom the presence and the position of electrical defects on the line 500.

Figure 6A:
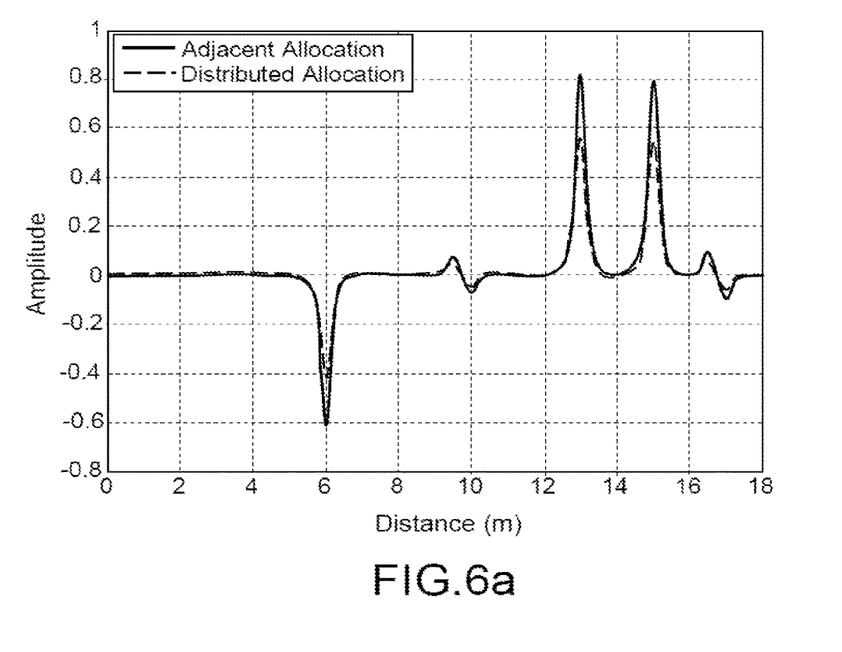
Figure 6B:
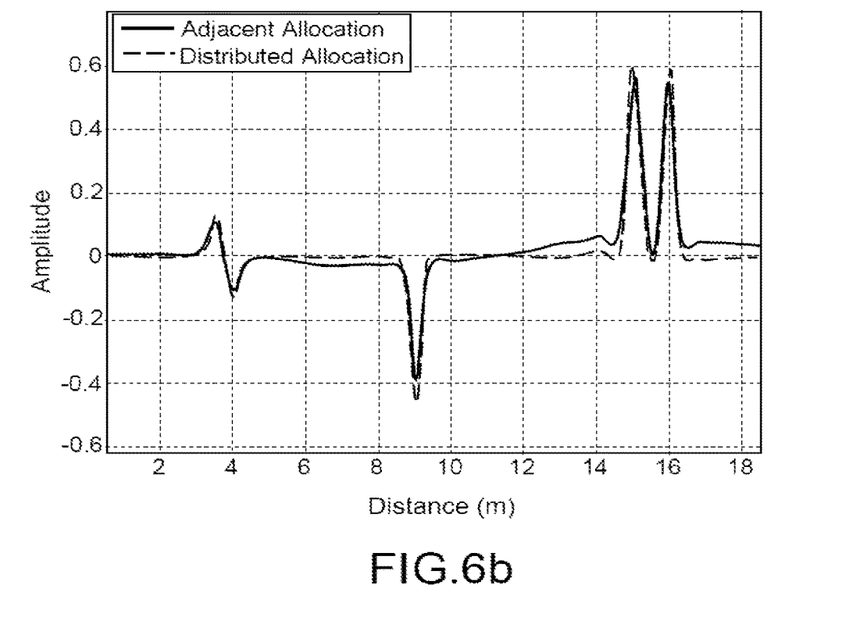
Figure 6C:
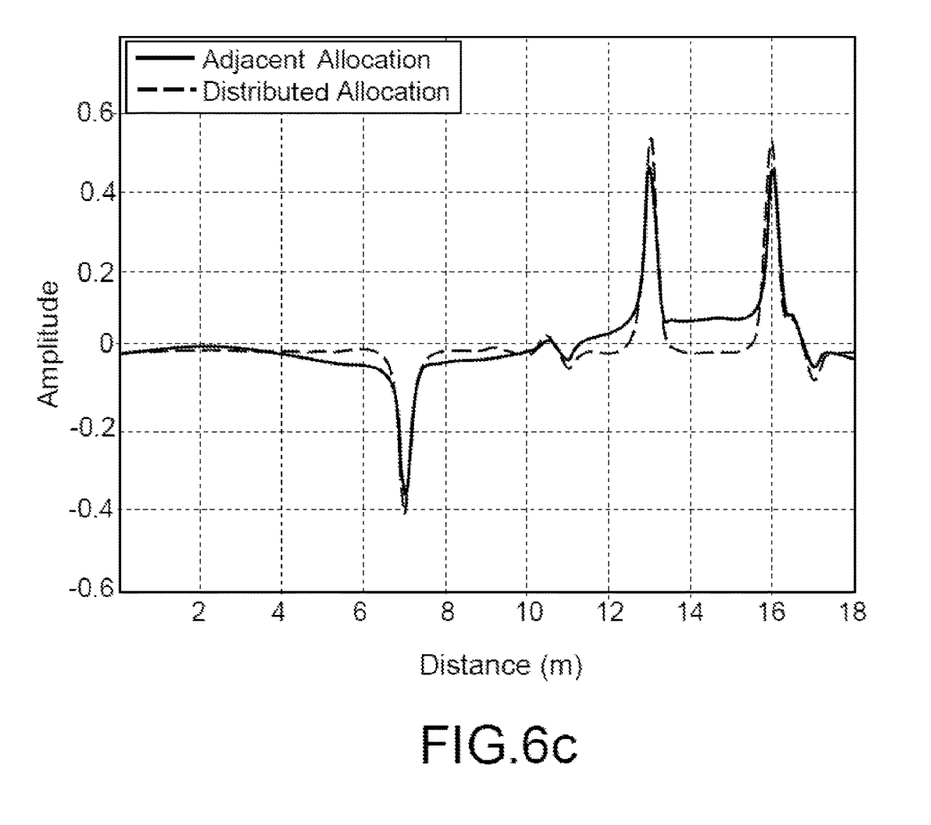

FIGS. 6a,6b,6c represent, on three amplitude-distance diagrams, the reflectograms obtained by three devices S1,S2,S3 respectively in the case where the allocation of the sub-carriers of the reflectometry signal is carried out in the manner described in FIG. 4a (so-called adjacent allocation) and in the case where the allocation of the sub-carriers of the reflectometry signal is carried out in the manner described in FIG. 4b (so-called distributed allocation).

It is noted that the quality of the diagnosis obtained for the three reflectometers in the case of distributed allocation is better than that obtained in the case of adjacent allocation. In particular, in the case of adjacent allocation, the reflectograms obtained by the devices S2 and S3 which use middle or high frequencies exhibit artifacts which are eliminated in the case of distributed allocation.

The invention can be implemented in the form of hardware elements and/or software elements. It can be implemented by a device comprising a processor and a memory. The processor can be a generic processor, a specific processor, an Application-Specific Integrated Circuit (ASIC) or a Field-Programmable Gate Array (FPGA).

[1] "Analysis of Spread Spectrum Time Domain Reflectometry for Wire Fault Location" by P. Smith, C. Furse, and J. Gunther. (Sensors Journal, IEEE, 5(6), pages 1469-1478, December 2005).

[2] "Noise Domain Reflectometry for Locating Wiring Faults" by Chet Lo and C. Furse. (Electromagnetic Compatibility, IEEE Transactions on, 47(1), pages 97-104, February 2005).

[3] "Multicarrier Reflectometry" by S. Naik, C M. Furse, and B. Farhang-Boroujeny. (Sensors Journal, IEEE, 6(3), pages 812-818, June 2006).

[4] "On Line Wire Diagnosis using Multicarrier Time Domain Reflectometry for Fault Location" by A. Lelong and M. Olivas. (Sensors Conference, IEEE, pages 751-754, October 2009).

[5] "Distributed Reflectometry-based Diagnosis for Complex Wired Networks" by N. Ravot, F. Auzanneau, Y. Bonhomme, M. O. Carrion, and F. Bouillault. (EMC: Safety, Reliability and Security of Communication and Transportation Syst, EMC Workshop, Paris, June 2007).

[6] "Distributed Reflectometry Method for Wire Fault Location Using Selective Average" by A. Lelong, L. Sommervogel, N. Ravot, and M. Olivas. (Sensors Journal, IEEE, 10(2), pages 300-310, February 2010).

[7] "OMTDR using BER estimation for ambiguities cancellation in ramified networks diagnosis", W. Ben Hassen, F. Auzanneau, L. Incarbone, F. Pérès, Ayeley P. Tchangani, IEEE, 2013

The invention claimed is:

1. A method for generating a reflectometry signal for a detection of faults on a transmission line or a network of transmission lines, said method being executed by a reflectometry device belonging to a distributed system comprising a plurality of reflectometry devices connected to said line or to said network of lines, said method comprising the steps of:
generating a multi-carrier electrical signal having a group of multiple frequency carriers regularly spaced into a frequency band subdivided into sub-carriers so that different frequency carriers of the group are allocated to each reflectometry device, and
injecting said electrical signal into said line or network of lines.

2. The method for generating a reflectometry signal of claim 1, wherein the sub-carriers are mutually orthogonal.

3. The method for generating a reflectometry signal of claim 1, wherein at least one sub-carrier is not allocated to any of the reflectometry devices of said distributed system.

4. The method for generating a reflectometry signal of claim 1, wherein at least one sub-carrier is reserved for communication between at least two reflectometry devices of said distributed system.

5. A method for analyzing faults on a transmission line or a network of transmission lines, said method being executed by a reflectometry device belonging to a distributed system comprising a plurality of reflectometry devices connected to said line or to said network of lines, said method comprising the steps of:
generating a multi-carrier electrical signal having a group of multiple frequency carriers regularly spaced into a frequency band subdivided into sub-carriers so that different frequency carriers of the group are allocated to each reflectometry device,
injecting said electrical signal into said line or network of lines,
measuring an echo of a reflected electrical signal, and
analyzing the echo to detect and/or locate discontinuities of impedance characteristic of at least one fault.

6. The method for analyzing faults of claim 5, wherein the step of analyzing the echo of said reflected electrical signal comprises at least the following sub-steps:
an inter-correlation of the reflected signal with the injected signal to obtain a first reflectogram,
a convolution of the first reflectogram with an apodization window to obtain a second reflectogram, and
an identification of amplitude spikes in said second reflectogram.

7. The method for analyzing faults of claim 6, wherein the apodization window is a Dolph-Chebyshev window.

8. The method for analyzing faults of claim 5, wherein the sub-carriers are mutually orthogonal.

9. The method for analyzing faults of claim 5, wherein at least one sub-carrier is not allocated to any of the reflectometry devices of said distributed system.

10. The method for analyzing faults of claim 5, wherein at least one sub-carrier is reserved for communication between at least two reflectometry devices of said distributed system.

11. A reflectometry device for generating a reflectometry signal for detecting faults on a transmission line or a network of transmission lines, said reflectometry device belonging to a distributed system comprising a plurality of reflectometry devices connected to said line or to said network of lines, said reflectometry device comprising means, including a processor, for executing the steps of:
generating a multi-carrier electrical signal having a group of multiple frequency carriers regularly spaced into a frequency band subdivided into sub-carriers so that different frequency carriers of the group are allocated to each reflectometry device, and
injecting said electrical signal into said line or network of lines.

12. The reflectometry device of claim 11, wherein the sub-carriers are mutually orthogonal.

13. The reflectometry device of claim 11, wherein at least one sub-carrier is not allocated to any of the reflectometry devices of said distributed system.

14. The reflectometry device of claim 11, wherein at least one sub-carrier is reserved for communication between at least two reflectometry devices of said distributed system.

15. A reflectometry device for analyzing faults on a transmission line or a network of transmission lines, said reflectometry device belonging to a distributed system comprising a plurality of reflectometry devices connected to said line or to said network of lines, said reflectometry device comprising means, including a processor, for executing the steps of:
generating a multi-carrier electrical signal having a group of multiple frequency carriers regularly spaced into a frequency band subdivided into sub-carriers so that different frequency carriers of the group are allocated to each reflectometry device,
injecting said electrical signal into said line or network of lines,
measuring an echo of a reflected electrical signal, and
analyzing the echo to detect and/or locate discontinuities of impedance characteristic of at least one fault.

16. The reflectometry device of claim 15, wherein the sub-carriers are mutually orthogonal.

17. The reflectometry device of claim 15, wherein at least one sub-carrier is not allocated to any of the reflectometry devices of said distributed system.

18. The reflectometry device of claim 15, wherein at least one sub-carrier is reserved for communication between at least two reflectometry devices of said distributed system.

19. A distributed system for detecting faults on a transmission line or a network of transmission lines, said system comprising a plurality of reflectometry devices connected to said line or to said network of lines, each reflectometry device comprising means, including a processor, for executing the steps of:

generating a multi-carrier electrical signal having a group of multiple frequency carriers regularly spaced into a frequency band subdivided into sub-carriers so that different frequency carriers of the group are allocated to each reflectometry device, injecting said electrical signal into said line or network of lines, measuring an echo of the reflected electrical signal, and analyzing the echo to detect and/or locate discontinuities of impedance characteristic of at least one fault.

20. The distributed system of claim 19, wherein the sub-carriers are mutually orthogonal.

\* \* \* \* \*